(12) United States Patent
Norioka et al.

(10) Patent No.: US 6,734,437 B2
(45) Date of Patent: May 11, 2004

(54) SYSTEM AND METHOD FOR ELECTRON BEAM IRRADIATION

(75) Inventors: Setsuo Norioka, Tokyo (JP); Toshiaki Miyokawa, Tokyo (JP); Naoki Date, Tokyo (JP); Jun Sasaki, Tokyo (JP); Yuichi Aki, Tokyo (JP); Yoshihisa Miura, Tokyo (JP)

(73) Assignees: JEOL Ltd., Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/374,764

(22) Filed: Feb. 25, 2003

(65) Prior Publication Data

US 2003/0178582 A1 Sep. 25, 2003

(30) Foreign Application Priority Data

Feb. 26, 2002 (JP) ........................................ 2002-049258

(51) Int. Cl.⁷ .................... G01N 23/00; H01J 37/252
(52) U.S. Cl. ........................ 250/441.11; 250/442.11; 250/492.3; 250/492.2; 250/306; 250/307; 250/310; 250/311
(58) Field of Search ................... 250/441.11, 442.11, 250/492.3, 492.2, 306, 307, 310, 311

(56) References Cited

U.S. PATENT DOCUMENTS

| | | | | |
|---|---|---|---|---|
| 4,596,928 A | * | 6/1986 | Dantilatos | 250/307 |
| 4,720,633 A | * | 1/1988 | Nelson | 250/310 |
| 4,823,006 A | * | 4/1989 | Danilatos et al. | 250/310 |
| 5,250,808 A | * | 10/1993 | Danilatos et al. | 250/310 |
| 5,557,314 A | * | 9/1996 | Okamoto et al. | 347/230 |
| 5,757,409 A | * | 5/1998 | Okamoto et al. | 347/230 |
| 5,864,142 A | * | 1/1999 | Muraki et al. | 250/491.1 |
| 5,905,267 A | * | 5/1999 | Muraki | 250/492.22 |
| 5,929,454 A | * | 7/1999 | Muraki et al. | 250/491.1 |
| 5,981,954 A | * | 11/1999 | Muraki | 250/397 |
| 6,107,636 A | * | 8/2000 | Muraki | 250/492.2 |
| 6,337,485 B1 | * | 1/2002 | Muraki | 250/492.2 |
| 6,472,672 B1 | * | 10/2002 | Muraki | 250/492.2 |
| 6,573,511 B2 | * | 6/2003 | Sasaki et al. | 250/441.11 |
| 2002/0057641 A1 | * | 5/2002 | Katsumura | |
| 2002/0117636 A1 | * | 8/2002 | Sasaki et al. | 250/492.3 |
| 2003/0116718 A1 | * | 6/2003 | Yamamoto et al. | 250/441.11 |

FOREIGN PATENT DOCUMENTS

| | | |
|---|---|---|
| JP | 60-089922 | 5/1985 |
| JP | 05-312962 | 11/1993 |

\* cited by examiner

Primary Examiner—John R. Lee
Assistant Examiner—Bernard Souw
(74) Attorney, Agent, or Firm—Webb Ziesenheim Logsdon Orkin & Hanson, P.C.

(57) ABSTRACT

An electron beam irradiation system for shooting an electron beam at a master disk to make recordings. This system is capable of focusing the beam easily and accurately in a corresponding manner to the master disk, thus permitting accurate recordings. The system has a support mechanism portion holding the master disk on it. The support mechanism portion has a slide table on which a focusing stage is placed. The focusing stage has a knife edge and a Faraday cup. The knife edge is located immediately beside the master disk. When recordings are made, an electron beam is first shot at the focusing stage and brought to focus. Then, the beam is shot at the master disk, thus making recordings.

13 Claims, 7 Drawing Sheets

SYSTEM AND METHOD FOR ELECTRON BEAM IRRADIATION

BACKGROUND OF THE INVENTION

1. Field of the Invention

The present invention relates to a system and method for electron beam irradiation that is used, for example, to make recordings on an optical master disk.

2. Description of Related Art

In recent years, the optical disk manufacturing industry has faced demands for higher recording densities. To achieve this, it is necessary to form smaller recording pits. Therefore, a machine for shining an electron beam at a master disk to make recordings has been proposed for manufacturing of optical master disks, it being noted that the electron beam is capable of forming smaller pits than are done by the prior art laser light. This proposed machine needs to accurately focus the electron beam in a corresponding manner to the master disk to permit accurate recordings.

One known electron beam irradiation system fitted with this means for focusing the electron beam is shown in FIG. 6, where an inverting table 41 that can be rotated by an inverting mechanism 42 is mounted inside a vacuum vessel 40. An electric motor 43 is fixedly mounted on the side of one end of the inverting table 41. A turntable 44 is mounted to the rotating shaft of the motor 43, and a master disk 45 is placed on the turntable 44. An electron beam is shone at the master disk 45 from electron beam irradiation portion 46 to make recordings.

In this known system, a focusing stage 47 is mounted at the other end of the inverting table 41, i.e., on the opposite side of the center of rotation of the table 41 from the turntable 44, to bring the electron beam into focus. The top surface of the focusing stage 47 is set flush with the master disk 45 placed on the turntable 44. To make recordings on the master disk 45, the focusing stage 47 is first made to correspond to the electron beam irradiation portion 46. Under this condition, the electron beam is shot at the top surface of the focusing stage 47, and the beam is focused with the electron beam irradiation portion 46. Then, the inverting table 41 is rotated through 180° (i.e., inverted) by the inverting mechanism 42 to make the master disk 45 correspond to the electron beam irradiation portion 46. In this state, the electron beam is shot at the master disk 45 to make recordings.

The prior art electron beam irradiation system constructed in this way has the following problem. This system is so designed that the master disk and the focusing stage are inverted and moved. Therefore, the master disk and focusing stage are spaced apart widely. Consequently, it is difficult to maintain them flush with each other accurately. Hence, it is difficult for this prior art system to align the focus of the electron beam to the master disk accurately. It is doubtful that accurate recordings will be accomplished.

Furthermore, in a machine utilizing an electron beam, the beam irradiation conditions are liable to change during the operation. Therefore, the probe current and the diameter of the beam can preferably be quantitatively measured in order to monitor the performance of the machine and to maintain and service it.

SUMMARY OF THE INVENTION

It is an object of the present invention to provide a system satisfying this requirement.

This object is achieved by an electron beam irradiation system having (a) a support mechanism portion having a slide table for holding a target irradiated with an electron beam such that the target can move radially, (b) electron beam irradiation portion for shooting the electron beam while keeping a part of the space lying over the target in a vacuum, and (c) a focusing stage for bringing the electron beam into focus. The focusing stage is fixedly mounted in a position adjacent to the target on the slide table of the support mechanism portion. This system is characterized in that the electron beam irradiation portion has a focusing lens for sharply focusing the electron beam onto the target and a deflector for scanning the beam in two dimensions. The system is also characterized in that the focusing stage has a built-in Faraday cup having a knife edge, the cup being capable of detecting the incident current.

The present invention also provides an electron beam irradiation method using an electron beam irradiation system having (a) a support mechanism portion having a slide table for holding a target irradiated with an electron beam such that the target can move radially, (b) electron beam irradiation portion for keeping a part of the space lying over the target in a vacuum and shooting the beam, the electron beam irradiation portion (b) being fitted with a focusing lens for sharply focusing the beam onto the target, the electron beam irradiation portion (b) being also fitted with a deflector for scanning the beam in two dimensions, and a focusing stage (c) for bringing the electron beam into focus. The focusing stage (c) has a built-in Faraday cup fixedly mounted in a position adjacent to the target on the slide table of the support mechanism. The Faraday cup has a knife edge and is capable of detecting the incident current as the beam is scanned across the knife edge. This method comprises the steps of: varying the focus of the beam using the focusing lens; scanning the beam across the knife edge using the deflector; detecting the output signal from the Faraday cup to thereby measure the diameter of the beam; optimizing the conditions of the focusing lens based on the results of the measurement to thereby focus the beam; and then moving the slide table and shooting the beam at the target.

Furthermore, the present invention provides a method of shooting an electron beam by the use of an electron beam irradiation system having (a) a support mechanism portion having a slide table for holding a target irradiated with an electron beam such that the target can move radially, (b) electron beam irradiation portion for keeping a part of the space lying over the target in a vacuum and shooting the beam, the electron beam irradiation portion (b) having a focusing lens for sharply focusing the beam onto the target, a deflector for scanning the beam in two dimensions, and a detector for detecting electrons emitted from a surface of the target by electron beam irradiation, and (c) a focusing stage for focusing the beam. The focusing stage is fitted with a Faraday cup fixedly placed in a position adjacent to the target on the slide table of the support mechanism portion. The Faraday cup has a built-in knife edge and is capable of detecting the incident current as the beam is scanned across the knife edge. This method comprises the steps of: shooting the beam onto the focusing stage while scanning the beam in two dimensions using the deflector; obtaining an SEM image by detecting electrons produced from the irradiated surface using the detector; setting the conditions of the focusing lens such that the sharpest SEM image is obtained while varying the focus of the beam using the focusing lens to thereby focus the beam; scanning the beam across the knife edge using the deflector; detecting the output signal from the Faraday cup to thereby measure the diameter of the beam; and then moving the slide table and shooting the beam at the target.

In the electron beam irradiation system described above, the electron beam is shot onto the focusing stage and the beam is brought to focus before recordings are made on the master disk. Then, the slide table is moved to a position where the master disk is started to be irradiated with the beam. The beam is shot onto the master disk, thus making recordings on it.

In this electron beam irradiation system according to the present invention, the distance between the master disk and the focusing stage is short. This is advantageous in increasing the accuracy at which the focusing stage is aligned to the master disk. Consequently, the electron beam can be focused accurately. This enables accurate recordings.

Other objects and features of the invention will appear in the course of the description thereof, which follows.

DESCRIPTION OF THE PREFERRED EMBODIMENTS

Figure 1:
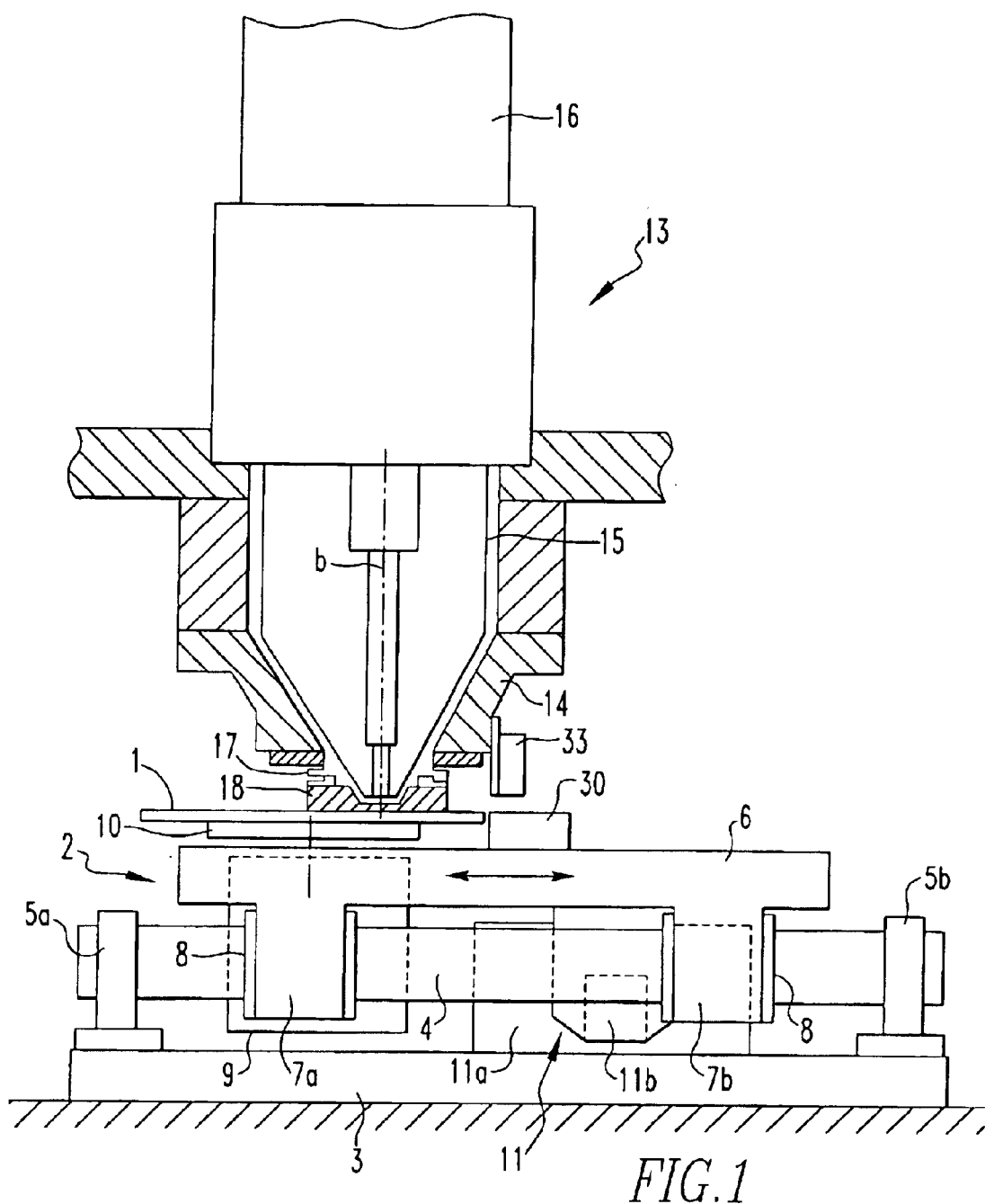
FIG. 1 is a front elevation in partial section of a locally evacuated electron beam irradiation system according to the present invention.

An electron beam irradiation system used for recording on optical master disks is hereinafter given as an example. As shown in FIG. 1, this system has an electron gun 16 emitting an electron beam b that is shot at a target consisting of a master disk 1 to make recordings of signals (i.e., recording pits of a signal pattern are formed).

Electron beam irradiation normally needs a vacuum environment. This system according to the present invention is characterized in that only the irradiated portion is in a vacuum environment, while the other parts are placed in the atmosphere. This is herein referred to as local pumping.

This system has a support mechanism portion 2 holding the master disk 1. This mechanism portion 2 is first described. The system has a pedestal 3 on which a guide rail 4 is placed horizontally. The left and right ends of the rail 4 are fixed at 5a and 5b, respectively. A slide table 6 has left and right legs 7a and 7b fitted with bearings 8. The slide table 6 is held on the guide rail 4 so as to be movable via the bearings 8.

A hydrostatic air bearing is used as each of the bearings 8. This can accomplish an accurate moving mechanism in which the frictional resistance produced when the slide table 6 moves is infinitesimal.

An electric motor 9, that is, means for rotating the master disk 1, is held to the slide table 6. A turntable 10 is mounted to the rotating shaft of the motor 9, and the master disk 1 is held horizontally on the turntable 10.

An electromagnetic-driven spindle motor is employed as the motor 9 that rotates the master disk. This motor 9 is driven based on a control signal from a control circuit. Thus, the master disk 1 is rotated together with the turntable 10.

A hydrostatic air bearing is used as the bearing for the rotating shaft of the motor 9. This reduces the load due to frictional resistance during rotation. As a consequence, an accurate rotating mechanism exhibiting good responsiveness can be accomplished.

In this system, a vacuum suction-type chucking means is used to hold the master disk 1 to the turntable 10. An electric motor 11, that is, means for moving the slide table 6, is disposed between the slide table 6 and the pedestal 3.

An electromagnetic-driven linear motor is used as the motor 11 for moving the slide table 6. A voice coil-type magnetic circuit, for example, is mounted between a stator 11a on the side of the pedestal 3 and a slider 11b on the side of the slide table 6. The motor 11 is driven based on a control signal from the control circuit. As a result, the slide table 6 is moved horizontally along the guide rail 4. The master disk 1 is moved radially together with the slide table 6.

The support mechanism portion 2 for the master disk 1 is constructed in this way. Electron beam irradiation portion 13 for evacuating a part of the space lying over the master disk 1 and shooting an electron beam is fixedly mounted over the support mechanism portion 2.

A vacuum chamber 14 is suspended from a position lying over the master disk 1. An electron beam column 15 is positioned within the vacuum chamber 14. The electron gun 16 that is a source of an electron beam is mounted upstream of the beam column 15 and emits the electron beam b.

Evacuation means consisting of a vacuum pump is connected to the vacuum chamber 14 containing the electron beam column 15. The inside of the vacuum chamber 14 is sucked by this evacuation means to maintain the inside of the column 15 at a degree of vacuum (about $1 \times 10^{-4}$ Pa) that will not hinder electron beam irradiation.

A hydrostatic floating pad 18 is mounted to the electron beam exit at the lower end of the vacuum chamber 14 via a stretchable connecting mechanism 17. This pad 18 floats at a slight height of about 5 $\mu$m over the master disk 1, i.e., is not in contact with the master disk. Under this condition, the beam b emitted from the electron gun 16 passes through an electron beam passage in the center of the pad 18 and strikes the master disk 1.

Figure 2:
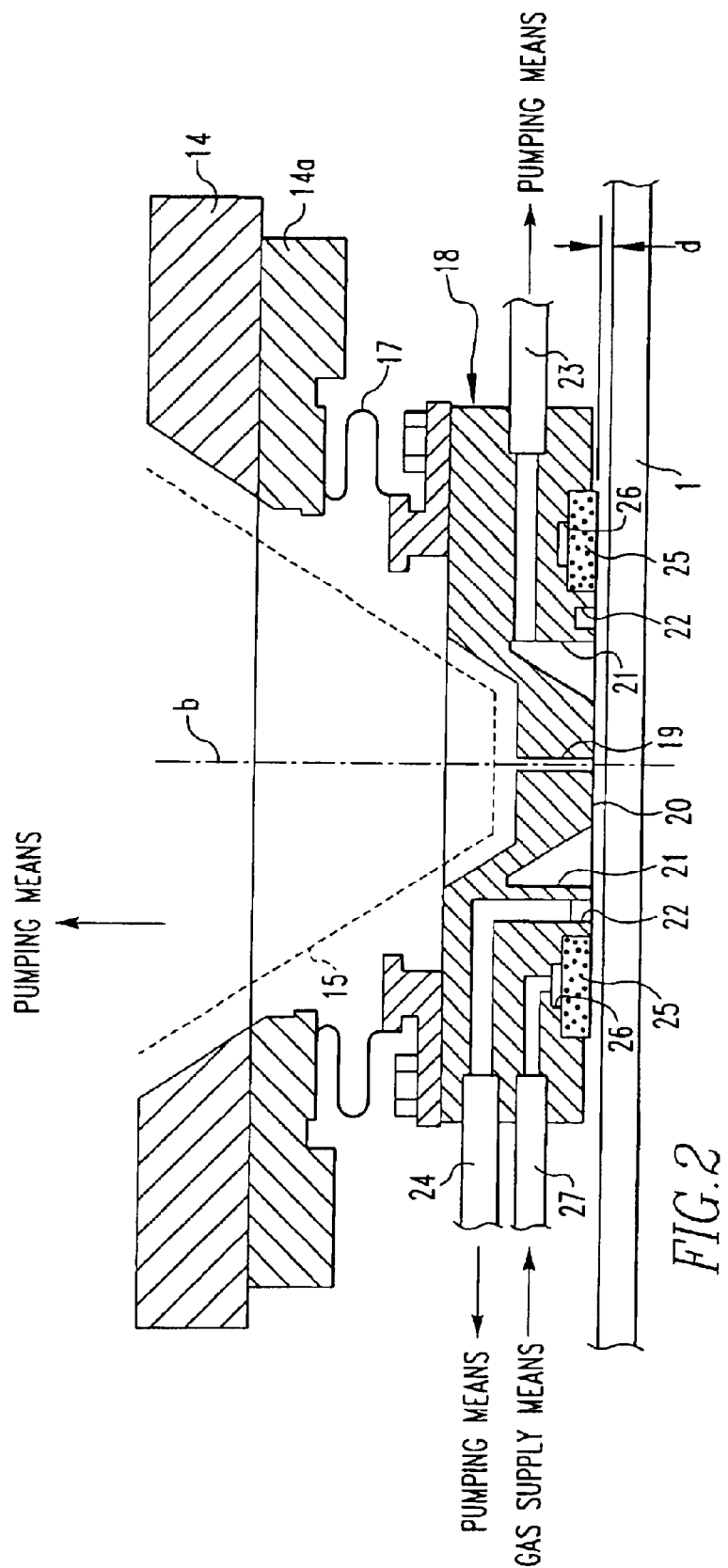
FIG. 2 is a vertical cross section showing the structure of a hydrostatic floating pad incorporated in the electron beam irradiation system shown in FIG. 1.

The structure of the hydrostatic floating pad 18 is shown particularly in FIG. 2. This pad 18 is centrally provided with the aforementioned electron beam passage indicated by numeral 19, through which the beam b passes. The pad 18 is made of a metallic block 20, for example. This block 20 is air-tightly connected to a stationary portion 14a at the lower end of the vacuum chamber 14 by the stretchable connecting mechanism 17 resembling a bellows. If the master disk 1 is not uniform in thickness or wobbles, extension or compression of the stretchable connecting mechanism 17 assures that the block 20 will follow the bumps or wobbling motion to thereby maintain the gap of about 5 μm.

The surface of the block 20 that is opposite to the master disk 1 is provided with a first suction groove 21 and a second suction groove 22 which are formed coaxially about the electron beam passage 19. These grooves 21 and 22 act as means for producing a force for pulling the block 20 toward the master disk 1.

Pumping means are connected with the first suction groove 21 and second suction groove 22 via exhaust tubes 23 and 24, respectively. These pumping means evacuate the first and second suction grooves 21, 22, i.e., draw in gas.

Vacuum pumps are used as these pumping means. In this case, vacuum pumps which can evacuate a suction groove closer to the beam passage 19 to a higher degree of vacuum are connected. In particular, a vacuum pump producing a degree of vacuum of approximately $1 \times 10^{-1}$ Pa, for example, is connected to the first suction groove 21 closer to the beam passage 19. A vacuum pump producing a degree of vacuum of about $5 \times 10^3$ Pa is connected to the outer, second suction groove 22. The space (indicated by the broken line in FIG. 2) between the electron beam column 15 and the vacuum chamber 14 or hydrostatic floating pad 18 is pumped down to a high degree of vacuum of about $1 \times 10^{-4}$ Pa by another vacuum pump (not shown).

A porous body 25 is buried in the block 20 and exposed to the surface opposite to the master disk 1 outside the second suction groove 22. This porous body 25 is made of an air-permeable porous material and formed annularly around the electron beam passage 19. A gas passage 26 is formed inside the block 20 on the rear side of the air-permeable porous body 25.

Gas supply means is connected to the gas passage 26 via a gas supply tube 27. Compressed gas at a positive pressure of about $5 \times 10^5$ Pa, for example, is supplied to the passage 26 from the gas supply means and ejected from the porous body 25.

The pumping means and gas supply means are operated when the hydrostatic floating pad 18 constructed as described above is placed on the master disk 1. The gas ejected from the porous body 25 slightly floats the pad 18 over the disk 1. At the same time, gas is sucked from the suction grooves 21 and 22, making a negative pressure inside the grooves. Consequently, the pad 18 is attracted to the master disk 1. The pad 18 floats over the master disk 1 while maintaining the gap d of about 5 μm. Since the pad 18 is not in contact with the master disk 1, the rotation of the master disk 1 is not hindered.

At this time, the gas ejected from the porous body 25 is sucked by the surrounding first and second suction grooves 21 and 22, respectively. Therefore, the ejected gas is prevented from reaching the electron beam passage 19. In this case, the gas from the porous body 25 is first drawn in by the second suction groove 22 and then by the first groove 21. The attracting force in the first groove 21 is stronger than that in the second groove 22. In consequence, the degree of vacuum can be increased toward the center of the hydrostatic floating pad 18. As a consequence, the inside of the vacuum chamber 14, i.e., the inside of the electron beam column 15, can be kept at a degree of vacuum (about $1 \times 10^{-4}$ Pa) that will not hinder the electron beam irradiation.

When a part of the space over the master disk 1 is kept in a vacuum by the hydrostatic floating pad 18, the electron beam b is shot at the master disk 1. At the same time, the motor 9 of the support mechanism portion 2 is driven to rotate the master disk 1. Also, the motor 11 is driven to move the master disk 1 radially. Thus, recordings are made on desired tracks.

With the electron beam irradiation system designed as described above, only the irradiated portion is kept in a vacuum; it is not necessary to keep a large space in a vacuum. Therefore, use of large pumping means (i.e., vacuum pump) can be dispensed with. Hence, the system can be fabricated in small size and at low cost.

It is necessary for this electron beam irradiation system to focus the electron beam accurately in a corresponding manner to the master disk, for permitting accurate recordings. In the present embodiment of the electron beam irradiation system, the means for focusing the electron beam is designed as follows. First, the aforementioned electron beam irradiation portion 13 has means for adjusting the focus of the electron beam and means for detecting the manner in which the beam is focused. Secondly, a focusing stage 30 is fixedly placed on the slide table 6 of the support mechanism portion 2 that supports the master disk 1.

Figure 7:
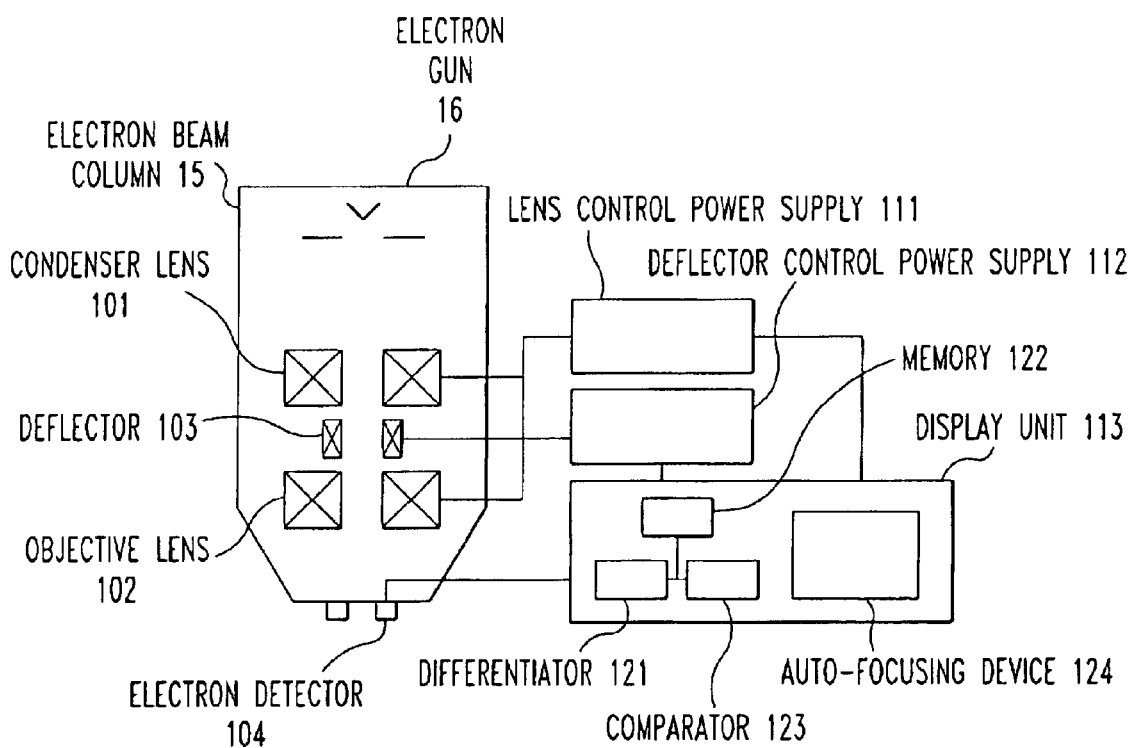
FIG. 7 is a block diagram illustrating the structure and operation of an electron beam-focusing means mounted in an electron beam irradiation system according to the present invention.

FIG. 7 shows the structure of the above-described focus-adjusting means. Referring to FIG. 7, the electron beam column 15 of the electron beam irradiation portion 13 includes a condenser lens 101 for setting the beam current of the electron beam to a desired value. The beam is produced by the electron gun 16 and given a desired energy. The electron beam column 15 further includes an objective lens (or focusing lens) 102 for sharply focusing the beam onto a target (or the master disk 1), a deflector 103 for scanning the focused beam over the irradiated surface in two dimensions, and a backscattered electron detector 104 for detecting backscattered electrons produced from the irradiated surface in response to the electron beam irradiation.

Figure 8:
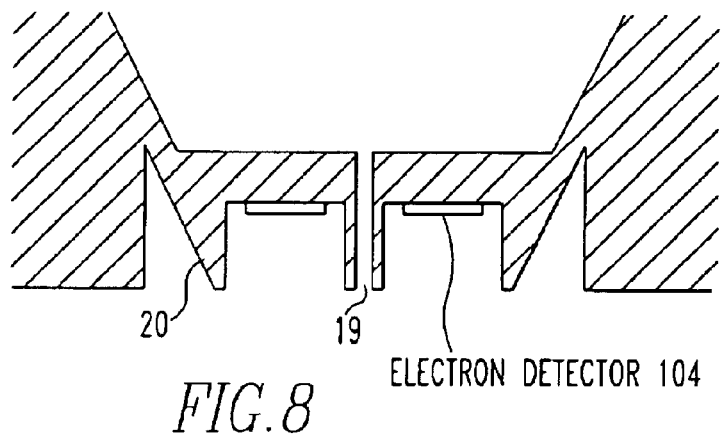
FIG. 8 is a cross-sectional view illustrating the arrangement of a backscattered electron detector used for focusing of an electron beam according to the present invention.

FIG. 8 is an enlarged view of a part of FIG. 2, illustrating a position in which the backscattered electron detector 104 is placed. In FIG. 8, the block 20 is provided with a recess in which an electron beam detector made of a semiconductor, for example, is mounted. The output signal from the detector can be taken out of the block 20. For this purpose, countermeasures (not shown) are taken to prevent the vacuum from deteriorating.

The electron beam irradiation portion 13 has a lens control power supply 111 for controlling the condenser lens 101 and the objective lens 102, a deflector control power supply 112 for controlling the deflector 103, and an electron microscope image display unit 113, as well as the electron beam column 15. The image display unit 113 amplifies the output signal from the backscattered electron detector 104, image processes the amplified signal in a desired manner, and displays an electron microscope image on a monitor scanned in synchronism with a scan signal for the deflector control power supply 112. This display unit 113 includes a differentiator circuit 121 for obtaining a differentiated signal from the image signal, a memory 122 for storing the image signal, and a signal comparator 123 for comparing two image signals.

In FIG. 7, for convenience of illustration, the memory 122 and comparator 123 are connected behind the differentiator circuit 121. It is to be noted that the signal passed through the differentiator circuit 121 is not always sent to its later stage after being differentiated. That is, the differentiator circuit 121 may be designed to either differentiate or not differentiate its input signal. Where an image is simply displayed on the monitor, no differentiation may be performed.

The electron microscope image display unit 113 further includes an autofocusing device 124 for automatically focusing the electron beam b by controlling the lens control power supply 111, deflector control power supply 112, differentiator circuit 121, memory 122, and signal comparator 123.

Figure 3:
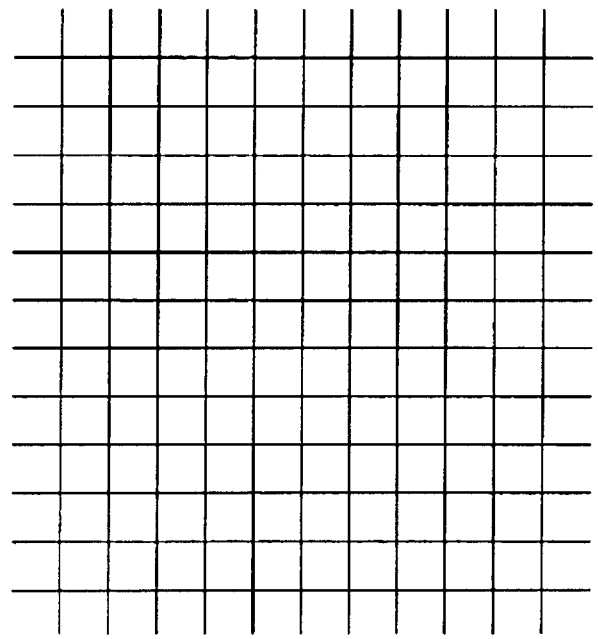
FIG. 3 shows a fine pattern formed on a focusing stage mounted in the electron beam irradiation system shown in FIG. 1.

The operation of the system constructed in this way is now described. First, the beam b is shot at the irradiated surface of the focusing stage 30. A pattern as shown in FIG. 3 and described later is formed on this irradiated surface. The beam current of the electron beam striking the irradiated surface is controlled to a desired value by controlling the condenser lens 101 using the lens control power supply 111. Then, the objective lens 102 is controlled using the lens control power supply 111 to set the focus of the beam b to a certain state. Subsequently, the deflector 103 is controlled using the deflector control power supply 112 to scan the beam b across the irradiated surface in two dimensions. Then, backscattered electrons produced in response to the electron beam irradiation are detected by the backscattered electron detector 104. The output signal from the detector is displayed as an electron microscope image on the monitor of the electron microscope image display unit 113.

Under this condition, if the focal conditions of the objective lens 102 are varied by controlling the lens control power supply 111, the state of focus of the electron microscope image on the monitor is observed to vary. The human operator observes the state of focus of the electron microscope image on the monitor and sets the conditions under which the lens control power supply 111 provides control of the objective lens 102 to achieve the best focus.

This operation can be automated as follows using the autofocusing device 124. When the operator of the system according to the present invention gives instructions to the autofocusing device 124 via a controlling computer (not shown) ancillary to the system, the autofocusing device 124 controls the various components as follows.

First, the lens control power supply 111 is controlled to set the objective lens 102 to certain focal conditions. At the same time, the deflector control power supply 112 is controlled to scan the electron beam b over the irradiated surface in two dimensions. An image signal obtained under these focal conditions is differentiated using the differentiator circuit 121. The resulting signal is stored in the memory 122 together with the information of the focal conditions. Then, the lens control power supply 111 is controlled to vary the focal conditions of the objective lens 102 slightly, and an image signal is again obtained. This signal is also differentiated. The resulting signal is compared with the differentiated image signal previously stored in the memory 122, using the signal comparator 123. A decision is made as to which of the two differentiated signals is greater. The greater differentiated signal is stored in the memory 122 along with the information of the focal conditions. In this embodiment, the focal conditions giving the greater differentiated signal means that the beam has been focused more sharply. Subsequently, the lens control power supply 111 is controlled to vary the focal conditions of the objective lens 102 slightly in turn. Comparisons are made within a desired range of the focal conditions of the objective lens 102. In this way, focal conditions giving rise to optimum focus are searched. Finally, the lens control power supply 111 is controlled to place the objective lens 102 under optimally focused conditions based on the stored information in the memory 122.

The present embodiment of the electron beam irradiation system is further characterized in that the focusing stage 30 is fixedly placed on the slide table 6 of the support mechanism portion 2 holding the master disk 1 as shown in FIG. 1.

This focusing stage 30 is closely spaced from the master disk 1 placed on the turntable 10 lying on the slide table 6 in the direction of movement of the slide table 6. In the present embodiment, the stage 30 is immediately to the right of the master disk 1. The top surface of the stage 30 is irradiated with the electron beam. A fine pattern used for focusing of the beam is formed on the irradiated surface. A lattice-like pattern, as shown in FIG. 3, is desirably used as this fine pattern.

The focusing stage 30 has a height-adjusting device for adjusting the height of the surface irradiated with the electron beam. It is conceivable that a stretching-and-contracting mechanism utilizing the pressure of gas or fluid or utilizing expansion and contraction produced by an energized piezoelectric device is used as the height-adjusting device. In the former case, no electromagnetic field is produced within the focusing stage and hence will not adversely affect the electron beam irradiation. Therefore, this mechanism can be preferably employed.

Figure 4:
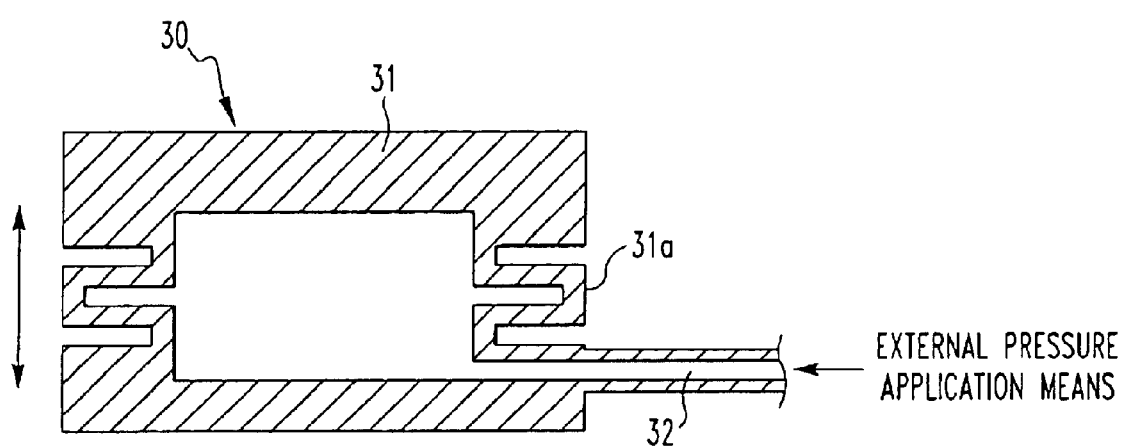
FIG. 4 is a vertical cross section showing the structure of the focusing stage mounted in the electron beam irradiation system shown in FIG. 1.

A specific example of this mechanism is given in FIG. 4, where the focusing stage 30 is made of a closed drum-type bellows 31 having a flexible portion 31a in its outer surface to permit the bellows to expand and contract in the vertical direction. External pressure application means, such as a pump, is connected to the bellows 31 via a conduit 32. Pressure of gas or fluid is supplied from the pressure application means into the bellows 31, expanding or contracting the bellows 31. As a result, the height of the focusing stage 30 is adjusted.

Figure 5A:
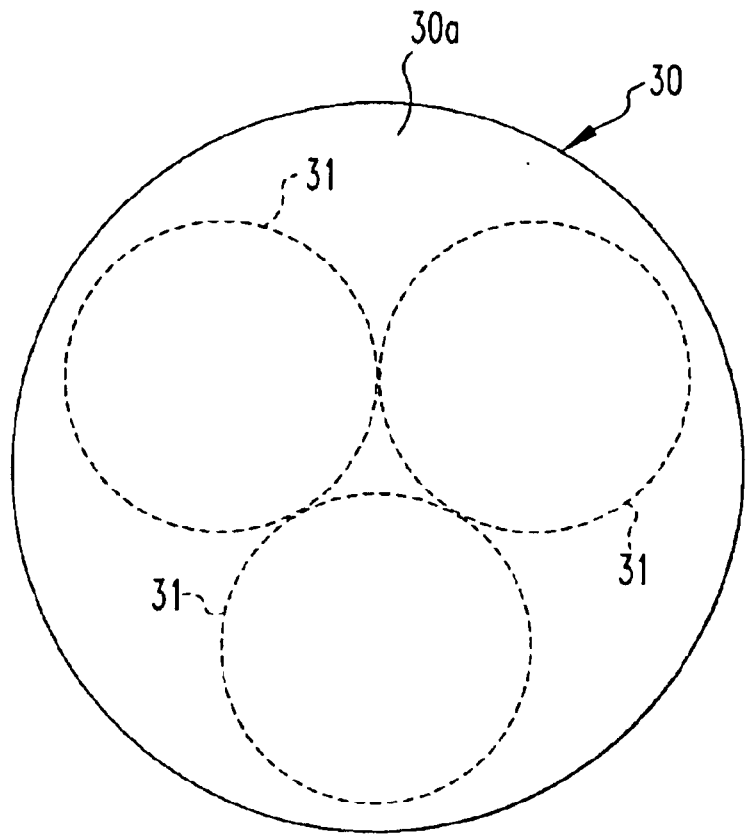
FIG. 5(A) is a plan view of a focusing stage.
Figure 5B:
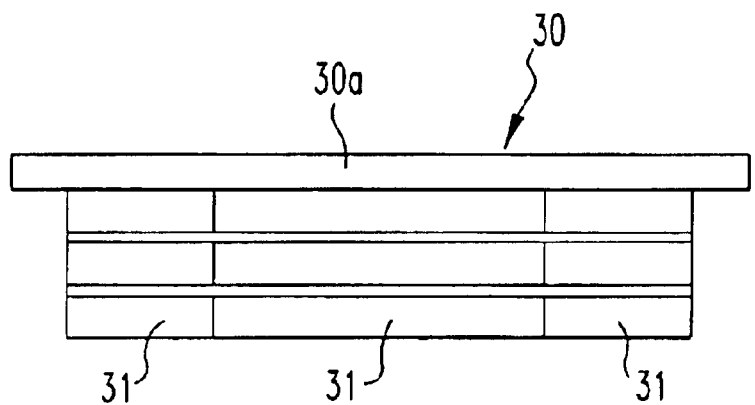
FIG. 5(B) is a side elevation of the focusing stage shown in FIG. 5(A)
Figure 6:
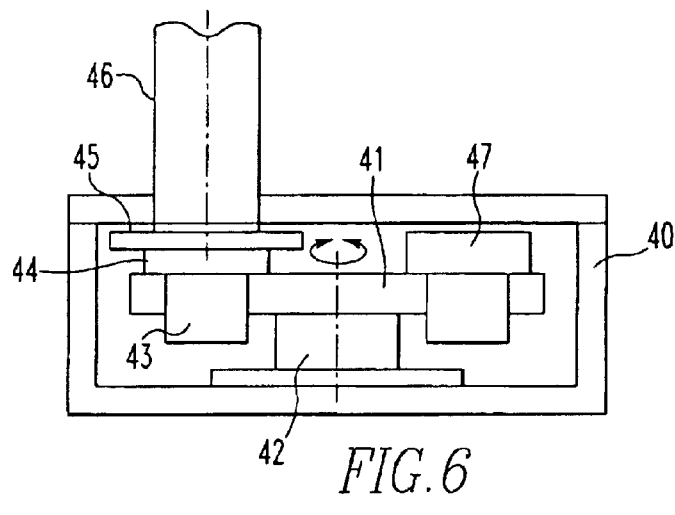
FIG. 6 is a side elevation of a known electron beam irradiation system.

FIGS. 5(A) and 5(B) show an example of a focusing stage using three bellows 31. This focusing stage 30 has a top plate 30a irradiated with an electron beam. This top plate 30a is supported by the three bellows 31 arranged triangularly.

Pressure of gas or fluid from the pressure application means is supplied to these three bellows 31 independently. The pressures supplied to these bellows 31 are made different to make the expansion ratios of the bellows 31 different. This permits the top plate 30a to tilt in every direction. Consequently, the tilt of the focusing stage 30 can also be adjusted.

In the present embodiment of the electron beam irradiation system, measuring device 33 is mounted on the side of the electron beam irradiation portion 13 in a corresponding manner to the master disk 1 on the support mechanism portion 2 and to the focusing stage 30.

This measuring device 33 is intended to measure the height of the master disk 1 and the height of the focusing stage 30. The measuring device 33 is fixed to the outer wall surface of the vacuum chamber 14 of the electron beam irradiation portion 13. An accurate measuring instrument, such as an electrostatic sensor, air micrometer, or laser measuring instrument, is used as the measuring device.

The sequence of operations of the present embodiment of the electron beam irradiation system fitted with the electron beam-focusing means constructed as described above is now described. In this system, the motor 11 is first driven to move the slide table 6 to the left as viewed in FIG. 1. The master disk 1 is set on the turntable 10 and fixed with a chucking means.

Since the present embodiment of the electron beam irradiation system is locally evacuated, vacuum suction can be used as the chucking means for holding the master disk. Therefore, it is easy to maintain the flatness of the master disk 1.

Then, the height of the top surface of the master disk 1 is measured by the measuring device 33 while moving the slide table 6 to the right. Thereafter, the slide table 6 is moved to the left. The height of the focusing stage 30 is made flush with the height of the top surface of the master disk 1 while measuring the height of the focusing stage 30 by the measuring device 33.

The slide table 6 is moved further to the left to make the focusing stage 30 correspond to the electron beam irradiation portion, and the electron beam is shot at the focusing stage 30. The beam is brought to focus.

The operation for focusing the electron beam is performed while observing the monitor connected with the electron microscope image display unit 113 of the electron beam irradiation portion 13 as described previously. In particular, a fine pattern (see FIG. 3), such as a lattice pattern, formed on the irradiated surface of the focusing stage 30, is displayed on this monitor. The human operator adjusts the lens control power supply 111 to bring the electron microscope image into focus while observing the pattern on the monitor. Alternatively, the focusing operation may be automated using the above-described autofocusing device 124 as described previously.

This operation for focusing the electron beam may also be performed using a Faraday cup having a knife edge as the focusing stage 30. This method is adapted for the case where the diameter of the electron beam is controlled more quantitatively. A configuration and operation for implementing this method is next described.

Figure 9:
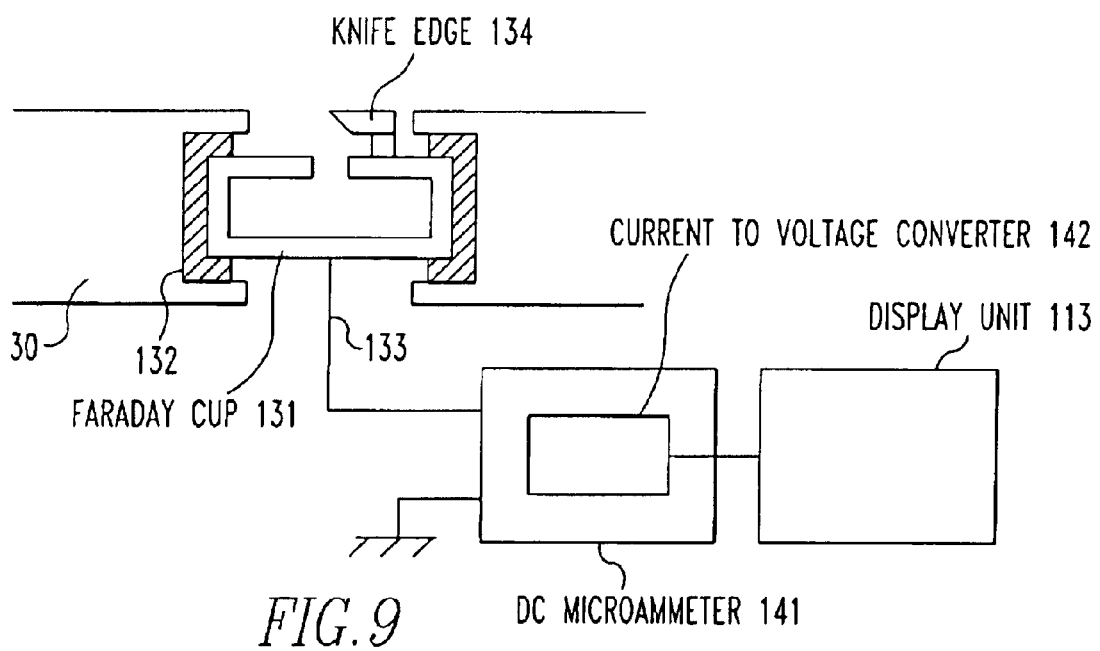
FIG. 9 is a vertical cross section showing a structure illustrating the configuration and operation of a Faraday cup used for focusing of an electron beam according to the present invention.

FIG. 9 shows the configuration and operation of a Faraday cup used to focus an electron beam b. The Faraday cup, indicated by numeral 131, is made of a metal and used to detect the electron beam b striking it. On detection, the Faraday cup 131 produces an electrical current. The cup is fitted in a recess formed in the focusing stage 30 to make the cup flush with the surface of the focusing stage 30.

A small hole is formed in the upper base of the Faraday cup 131. The electron beam b is so shot that it passes through the hole. The size of the hole is set sufficiently small compared with the bottom surface and height of the Faraday cup 131. Therefore, almost all the electrons are captured within the Faraday cup 131. The current of the beam b, i.e., the probe current, can be known by measuring the current flowing through the Faraday cup 131. This cup 131 is mounted within the focusing stage 30 and electrically isolated from the focusing stage 30 by an electrical insulator 132. A conductor wire 133 is laid to extract electrons captured within the Faraday cup 131 as an electrical current. The probe current of the beam b can be measured by inserting a DC microammeter 141 between the wire 133 and ground. More specifically, the DC microammeter 141 converts the output current from the conductor wire 133 into a voltage by the use of a current-to-voltage converter 142. The output voltage is accepted into the above-described electron microscope image display unit 113.

A knife edge 134 is mounted to cover a part of the hole in the upper base of the Faraday cup 131. The knife edge 134 is made of a piece of a metal having a literally sharp knife edge. Practically, a silicon piece having a wedge-shaped end is used for ease of fabrication. In principle, the knife edge 134 should be electrically isolated from the Faraday cup 131 and mounted to the focusing stage 30 that is at ground potential. However, for ease of fabrication and practicability, the knife edge may be mounted on the upper surface of the Faraday cup 131. The top surface of the knife edge 134 is made flush with the top surface of the focusing stage 30.

More preferably, two knife edges 134 extending perpendicular to each other may be mounted. For example, one knife blade extends tangentially to the circumference of the master disk 1, while the other extends diametrically of the master disk 1.

The operation of this focusing operation using the Faraday cup 131 is next described. The deflector 103 is controlled via the deflector control power supply 112 to scan the electron beam b in one dimension so that the beam perpendicularly crosses the knife edge 134. Variations in the electrical current detected by the Faraday cup 131 at this time are graphed as shown in FIG. 10.

Figure 10:
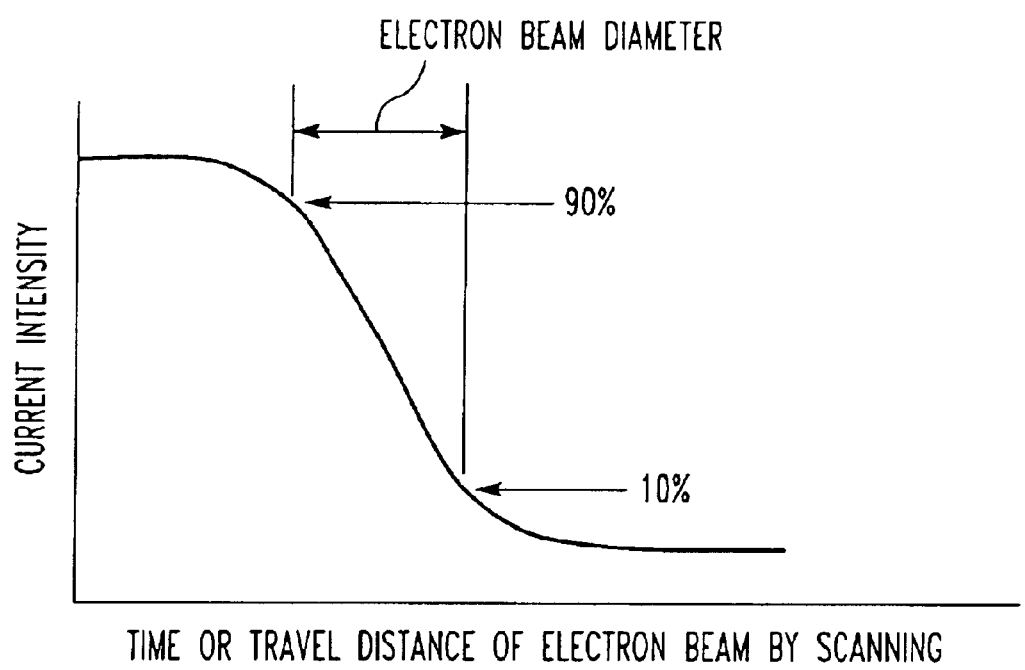
FIG. 10 is a graph illustrating the relation between variations in the strength of the current flowing through the Faraday cup shown in FIG. 9 and the diameter of the electron beam.

In FIG. 10, the horizontal axis indicates the time axis and varying in proportion to the distance traveled by the electron beam b by the scanning. The vertical axis indicates the intensity of current detected by the Faraday cup 131. In the illustrated example, the left side indicates a case where the irradiation is done in such a way that the beam b passes through the hole in the Faraday cup 131. The right side indicates a case where the beam b is shot at the upper surface of the knife edge 134 and is not directed at the hole in the Faraday cup 131. The intervening portions where the current intensity varies continuously indicate values of the diameter of the beam b. That is, the diameter of the electron beam b is defined as the distance that is traveled by the beam and corresponds to the current intensities from 10% to 90% of the difference between the current intensity when the leftmost beam b fully strikes the Faraday cup 131 and the current intensity when the rightmost beam b fully strikes the upper surface of the knife edge 134. More strictly, the diameter is a value obtained when the cross section of the beam b is a true circle. Alternatively, the diameter is a value measured in the scanning direction of the electron beam b. The probe current of the beam b is the current intensity obtained when the beam passes through the hole in the Faraday cup 131 without being hindered by the knife edge 134.

The current through the Faraday cup 131 varying in this way is applied to the DC microammeter 141 via the conductor wire 133, converted into a voltage by the current-to-voltage converter 142, and accepted into the electron microscope image display unit 113. The signal accepted into the display unit 113 can be stored in the memory 122, compared with other signals, or displayed as a graph on the monitor scanned in one dimension in synchronism with the scan signal for the deflector control power supply 112.

Of course, focusing can be done using the data derived by the aforementioned one-dimensional scan. One example is given below.

First, the lens control power supply 111 is controlled to place the objective lens 102 under certain focal conditions. At the same time, the deflector control power supply 112 is controlled to scan the electron beam b in one direction to cause the beam to cross the knife edge 134. A signal indicative of the current intensity obtained under these focal conditions is accepted into the autofocusing device 124 of the display unit 113. The autofocusing device 124 finds the scanning distance from the accepted signal, the scanning distance being from 10% to 90% of the difference between maximum and minimum values, and stores the found value in the memory 122 together with the information of the focal conditions. Then, the lens control power supply 111 is controlled to vary the focal conditions of the objective lens slightly. Again, a signal indicative of the current intensity is obtained. A scanning distance giving 10% to 90% of the difference between the maximum and minimum values is obtained from the signal indicative of the current density. This obtained scanning distance is compared with each value of the scanning distance already stored in the memory 122 using the signal comparator 123. A decision is made as to which is smaller. The smaller value is stored in the memory 122 along with the information of the focal conditions. In this embodiment, focal conditions giving the smaller value mean that focusing has been better achieved. Subsequently, the lens control power supply 111 is controlled to vary the focal conditions of the objective lens 102 in increments. Comparisons are made within a desired focal range of the objective lens 102. In this way, focal conditions under which the beam is focused optimally are searched. Finally, the lens control power supply 111 is controlled to place the objective lens 102 under the optimum focusing conditions based on the stored information.

An optical system using an electron beam as in the present invention has the advantage that it can achieve finer lithography than done using light. On the other hand, in order to maintain the system and to bring out the performance at all times, the following points should be taken into account.

(1) The minimum diameter of the electron beam b depends on the probe current, i.e., the dose received by the target. Furthermore, there is an upper limit to the maximum dose obtained where lithography is performed at a given diameter. The upper limit is determined by the design of the electron optical system.

(2) In the electron optical system according to the present invention, a sample, or a target, introduced from the outside of the system contacts the optical system via a vacuum, i.e., is substantially directly exposed to the optical system. As this open-type electron optical system is operated, a trace contaminant is sintered to the inner wall of the electron beam column 15. If this contaminant is electrically charged at all, it distorts the cross section of the electron beam b from its original true circle. This, in turn, deteriorates the relation between the aforementioned diameter and the probe current.

(3) As such, the minimum diameter of the electron beam b and the probe current are actually measured by the Faraday cup method using the above-described knife edge and stored as reference data. As the need arises, the performance of the system is checked. This offers convenience and high efficiency.

Accordingly, the conditions of the condenser lens 101 are set using the lens control power supply 111 so that the probe current assumes a given value. When the beam is focused with the objective lens 102, the diameter of the beam b is measured by the Faraday cup method using the above-described knife edge and stored in the memory 122. This procedure is repeated with different probe current values. That is, plural sets of conditions are found. Immediately before the system is operated routinely, the conditions of the lens control power supply 111 are so set that a desired probe is obtained. After the beam is brought to focus, the diameter of the beam is measured by the Faraday cup method using the knife edge described above and compared with data stored in the memory 122. If the difference between both is within a given range, the system is judged to be normal.

As already described, contaminant sintered to the inner wall of the electron beam column 15 is electrically charged to thereby distort the beam b. As a result, the cross section of the beam is deformed out of its original true circle. This distortion is known as astigmatism. A stigmator (not shown) is incorporated in the electron beam column 15 to return the beam b to the true circle. When an operation for focusing the electron beam while watching the monitor connected with the electron microscope image display unit 113 is performed, this stigmator is also manually operated. Similarly, where the autofocusing device 124 is used, an autofocusing operation is automatically carried out using astigmatic correction also in a manner not illustrated.

The current is accepted into the electron microscope image display unit 113 from the Faraday cup 131 having the knife edge 134. Focusing can be done using data about the current. The probe current of the electron beam b and the beam diameter can be quantitatively grasped. Furthermore, it can be seen that monitoring such quantitative values is useful in maintaining and servicing the system.

Focusing using a one-dimensional waveform crossing the knife edge 134 and measurement of the beam diameter may also be done using the output signal from the backscattered electron detector 104 instead of the signal from the Faraday cup 131 via the conductor wire 133. Note that the output signal from the backscattered electron detector 104 is inverted in waveform with respect to the signal from the Faraday cup 131.

After completion of the focusing of the electron beam, the slide table 6 is moved to the position where the beam is directed. Recordings using electron beam irradiation are started here.

Simultaneously with the electron beam irradiation, the motor 9 is driven to rotate the master disk 1. Also, the motor 11 is driven to move the master disk 1 radially. In this way, recordings are made on desired tracks.

After the end of the recordings, the slide table 6 is shifted to the left. The master disk 1 that has been held to the turntable 10 by vacuum suction is released and taken out.

In the present embodiment of the electron beam irradiation system, focusing of the electron beam can be done easily in this way. This system is especially characterized in that the focusing stage 30 is positioned immediately beside the master disk 1 on the slide table 6. The fact that the distance to the master disk 1 is short contributes to improvement of the accuracy at which the focusing stage 30 can be made flush with the master disk 1. Consequently, with this electron beam irradiation system, the electron beam can be focused more accurately in a corresponding manner to the master disk 1. This permits accurate recordings.

While some embodiments of the present invention have been described, the invention is not limited thereto but can be practiced in many other forms.

As can be understood from the description provided thus far, the present invention provides an electron beam irradiation system in which only the portion irradiated with an electron beam is evacuated. A focusing stage is mounted in a position adjacent to a target on a slide table that supports the target. Therefore, the electron beam can be focused easily and accurately in a corresponding manner to the target. As a result, accurate recordings can be accomplished. Especially, the probe current of the electron beam and the beam diameter can be quantitatively measured and managed.

Having thus described our invention with the detail and particularity required by the Patent Laws, what is desired protected by Letters Patent is set forth in the following claims.

The invention claimed is:

1. An electron beam irradiation system comprising:
  a support mechanism comprising a slide table for holding and rotating a target for being irradiated with an electron beam such that the target can move radially, said support mechanism being placed in the atmosphere;

electron beam irradiation portion for shooting the electron beam while maintaining a space over said target in a vacuum;

means between the electron beam irradiation portion and the support mechanism comprising a floating pad with beam passage therein and stretchable connecting means for maintaining a vacuum in an enclosed space adjacent the target; and a focusing stage onto which said electron beam may be irradiated for bringing the electron beam into focus, said focusing stage being fixedly mounted in a position adjacent to said target on the slide table of said support mechanism;

said electron beam irradiation portion having a focusing lens for sharply focusing the electron beam onto said target and a deflector for scanning said electron beam in two dimensions;

said focusing stage having a built-in Faraday cup having a knife edge, said Faraday cup being capable of detecting an incident current.

2. The electron beam irradiation system of claim 1, wherein said focusing stage has a height-adjusting device for adjusting the height of said surface irradiated with the electron beam according to the thickness of said target.

3. The electron beam irradiation system of claim 2, wherein said height-adjusting device uses a mechanism that expands and contracts by making use of pressure created by gas or fluid.

4. The electron beam irradiation system of claim 1, wherein said electron beam irradiation portion has a height-measuring device for measuring the height of said target and the height of said focusing stage.

5. The electron beam irradiation system of any one of claims 1 to 4, wherein there is further provided storage memory for storing an output signal from said Faraday cup when the electron beam is scanned at least in one dimension using said deflector, display unit, and comparison unit for comparing plural signals.

6. The electron beam irradiation system of any one claims 1 to 4, wherein a fine lattice pattern is formed on a surface of said focusing stage that is irradiated with the electron beam, and wherein there is further provided a detector for detecting electrons emitted from said surface by the electron beam striking it.

7. The electron beam irradiation system of claim 6, wherein there is further provided storage memory for storing at least one of an output signal from said Faraday cup and said detector for detecting electrons emitted from the irradiated surface when the electron beam is scanned at least in one dimension using said deflector, display unit, and comparison unit for comparing plural signals.

8. The electron beam irradiation system of any one of claims 1 to 4, wherein a turntable for rotating the target is mounted on said slide table.

9. An electron beam irradiation method using an electron beam irradiation system having:
(a) a support mechanism comprising a slide table for holding and rotating a target to be irradiated with an electron beam such that the target can move radially, said support mechanism being placed in the atmosphere;
(b) electron beam irradiation portion for keeping a part of a space lying over the target in a vacuum and shooting the beam, said electron beam irradiation portion being fitted with a focusing lens for sharply focusing the beam onto said target, said electron beam irradiation portion being also fitted with a deflector for scanning the beam in two dimensions;
(c) means between the electron beam irradiation portion and the support mechanism comprising a floating pad with beam passage therein and stretchable connecting means for maintaining a vacuum in an enclosed space adjacent the target; and
(d) a focusing stage onto which said electron beam may be irradiated for bringing the electron beam into focus, said focusing stage being fixedly mounted in a position adjacent to said target on said slide table of said support mechanism, said focusing stage having a built-in Faraday cup having a knife edge, said Faraday cup being capable of detecting an incident current, said method comprising the steps of:
varying focus of the electron beam using said focusing lens;
scanning said beam across the knife edge using said deflector;
detecting an output signal from said Faraday cup to thereby measure a diameter of said electron beam;
optimizing conditions of the focusing lens based on results of the measurement to thereby focus the beam; and
then moving the slide table and shooting the beam at said target.

10. An electron beam irradiation method using an electron beam irradiation system having:
(a) a support mechanism comprising a slide table for holding and rotating a target irradiated with an electron beam such that the target can move radially, said support mechanism being placed in the atmosphere;
(b) electron beam irradiation portion for keeping a part of a space lying over said target in a vacuum and shooting the beam, said electron beam irradiation portion having a focusing lens for sharply focusing the beam onto said target, a deflector for scanning the beam in two dimensions, and a detector for detecting electrons emitted from a surface of said target by electron beam irradiation;
(c) means between the electron beam irradiation portion and the support mechanism comprising a floating pad with beam passage therein and stretchable connecting means for maintaining a vacuum in an enclosed space adjacent the target; and
(d) a focusing stage onto which said electron beam may be irradiated for focusing the beam, said focusing stage being fitted with a Faraday cup fixedly placed in a position adjacent to the target on the slide table of said support mechanism, said Faraday cup having an attached knife edge, said Faraday cup being capable of detecting an incident current, said method comprising the steps of:
shooting the electron beam onto said focusing stage while scanning the beam in two dimensions using said deflector;
obtaining an SEM image by detecting electrons produced from the irradiated surface using said detector;
setting conditions of the focusing lens such that the sharpest SEM image is obtained while varying focus of the beam using the focusing lens to thereby focus the beam;
scanning the electron beam across the knife edge using said deflector;

detecting at least one of an output signal from said Faraday cup and said detector to thereby measure a diameter of said electron beam; and then moving said slide table and shooting the beam at said target.

11. An electron beam irradiation method as set forth in any one of claims 9 and 10, further comprising the steps of:

detecting the output signal from said Faraday cup to measure a beam current of said electron beam;

examining a relation between said beam current and said diameter of said electron beam; and comparing this relation with a relation holding between a reference beam current and the diameter of the electron beam.

12. An electron beam irradiation method as set forth in any one of claims 9 to 11, wherein:

(a) said focusing stage has a height-adjusting device for adjusting the height of the irradiated surface according to the thickness of said target;

(b) said electron beam irradiation portion has a measuring device for measuring the height of said target and the height of said focusing stage;

(c) the heights of said target and of said focusing stage are measured prior to implementation of said method; and (d) the height of said focusing stage is adjusted using the height-adjusting device.

13. An electron beam irradiation method as set forth in claim 9 or 10, wherein said support mechanism portion has a turntable which is mounted on said slide table such that the target can rotate.

* * * * *

UNITED STATES PATENT AND TRADEMARK OFFICE
CERTIFICATE OF CORRECTION

PATENT NO.   : 6,734,437 B2
DATED        : May 11, 2004
INVENTOR(S)  : Norioka et al.

It is certified that error appears in the above-identified patent and that said Letters Patent is hereby corrected as shown below:

Column 13,
Line 42, "any one claims" should read -- any one of claims --.

Signed and Sealed this

First Day of February, 2005

JON W. DUDAS
*Director of the United States Patent and Trademark Office*